United States Patent
Seong et al.

(10) Patent No.: US 9,978,911 B2
(45) Date of Patent: May 22, 2018

(54) LIGHT-EMITTING DIODE DEVICE FOR ENHANCING LIGHT EXTRACTION EFFICIENCY AND CURRENT INJECTION EFFICIENCY

(71) Applicants: Tae Yeon Seong, Seoul (KR); Jee-Yun Lee, Busan (KR); Dae-Hyun Kim, Seoul (KR); Ki Seok Kim, Hwaseong-si (KR)

(72) Inventors: Tae Yeon Seong, Seoul (KR); Jee-Yun Lee, Busan (KR); Dae-Hyun Kim, Seoul (KR); Ki Seok Kim, Hwaseong-si (KR)

(73) Assignee: Korea University Research and Business Foundation, Seoul (KR)

( * ) Notice: Subject to any disclaimer, the term of this patent is extended or adjusted under 35 U.S.C. 154(b) by 0 days. days.

(21) Appl. No.: 15/608,626

(22) Filed: May 30, 2017

(65) Prior Publication Data

US 2017/0358714 A1    Dec. 14, 2017

(30) Foreign Application Priority Data

Jun. 9, 2016    (KR) ........................ 10-2016-0071679

(51) Int. Cl.
*H01L 33/06* (2010.01)
*H01L 33/42* (2010.01)
*H01L 33/14* (2010.01)
*H01L 33/32* (2010.01)

(52) U.S. Cl.
CPC .............. *H01L 33/42* (2013.01); *H01L 33/06* (2013.01); *H01L 33/145* (2013.01); *H01L 33/32* (2013.01)

(58) Field of Classification Search
CPC .......... H01L 33/42; H01L 33/32; H01L 33/06; H01L 33/145
See application file for complete search history.

(56) References Cited

U.S. PATENT DOCUMENTS

2016/0099385 A1* 4/2016 Kim .................... H01L 33/0079
257/98

FOREIGN PATENT DOCUMENTS

| KR | 1020120011248 A | 2/2012 |
| KR | 1020140118654 A | 10/2014 |
| KR | 1020150000786 A | 1/2015 |

\* cited by examiner

*Primary Examiner* — David Vu
(74) *Attorney, Agent, or Firm* — Andrew D. Fortney; Central California IP Group, P.C.

(57) ABSTRACT

Provided is a GaN light-emitting diode (LED) device. The LED device may include a substrate, an n-type GaN layer on the substrate, an active layer on the n-type GaN layer, a p-type GaN layer on the active layer, a current spreading layer including a transparent conductive metal oxide material on the p-type GaN layer, a plurality of upper current injection electrodes provided on the current spreading layer to be spaced apart from each other, an upper electrode pattern extending to cover the upper current injection electrodes, and an upper electrode pad electrically connected to the upper electrode pattern. The upper electrode pattern may include first and second upper electrode patterns, which are sequentially stacked and are a silver or silver alloy thin layer and a transparent conductive metal oxide thin layer, respectively.

15 Claims, 17 Drawing Sheets

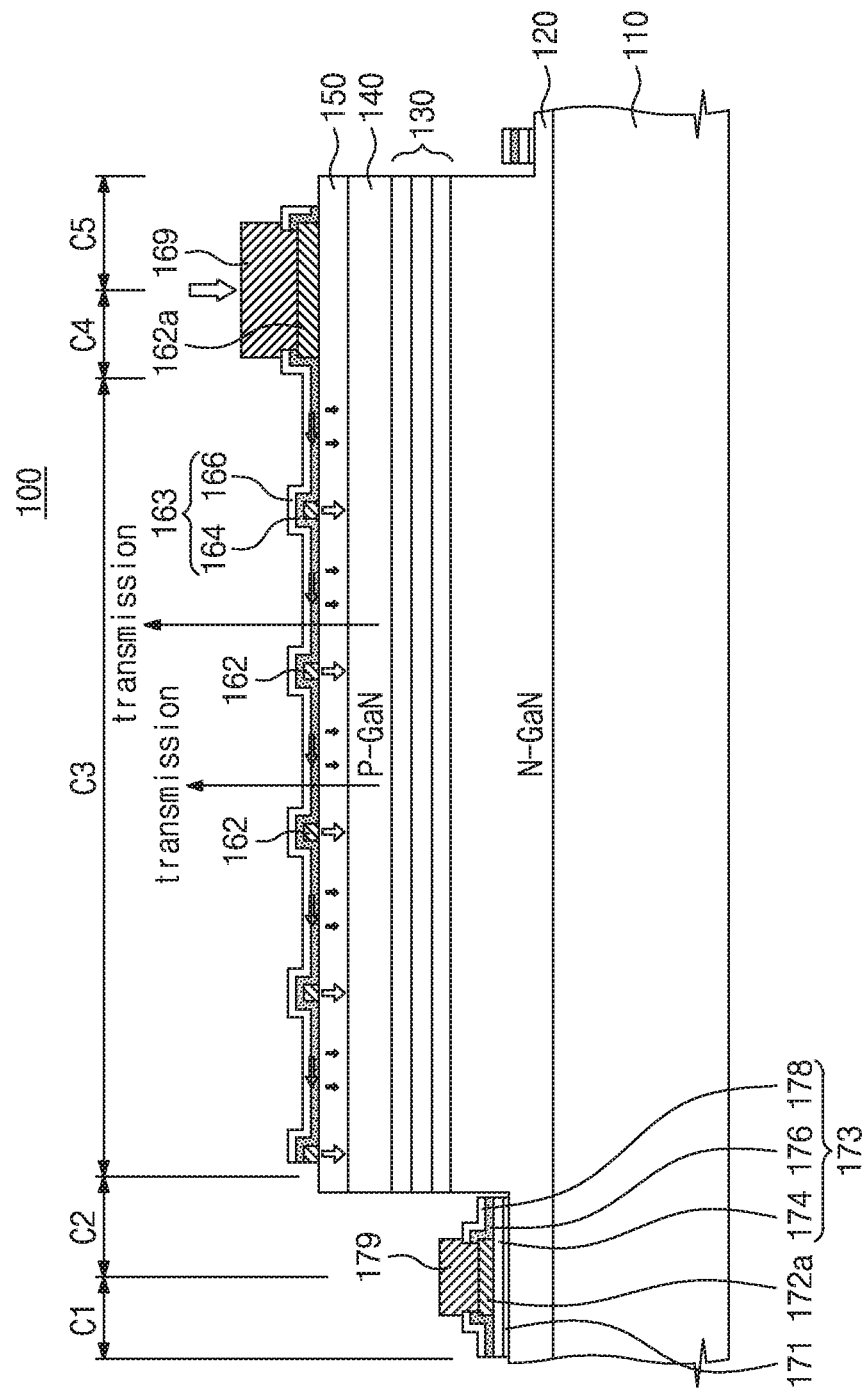

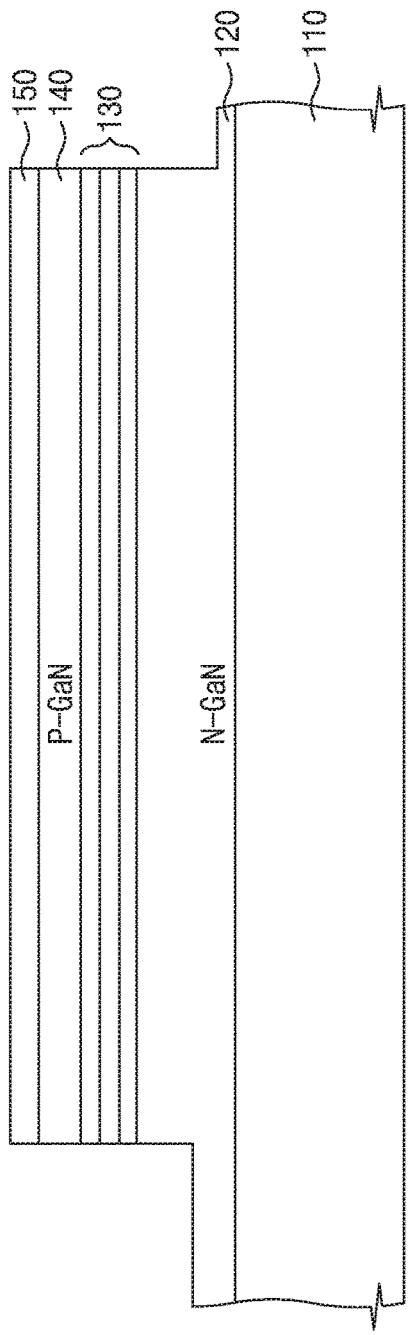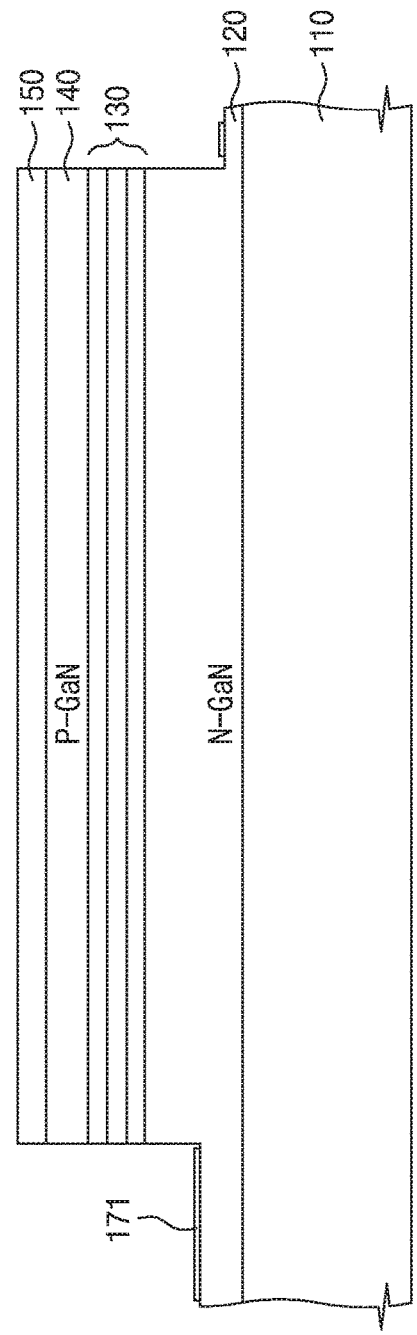

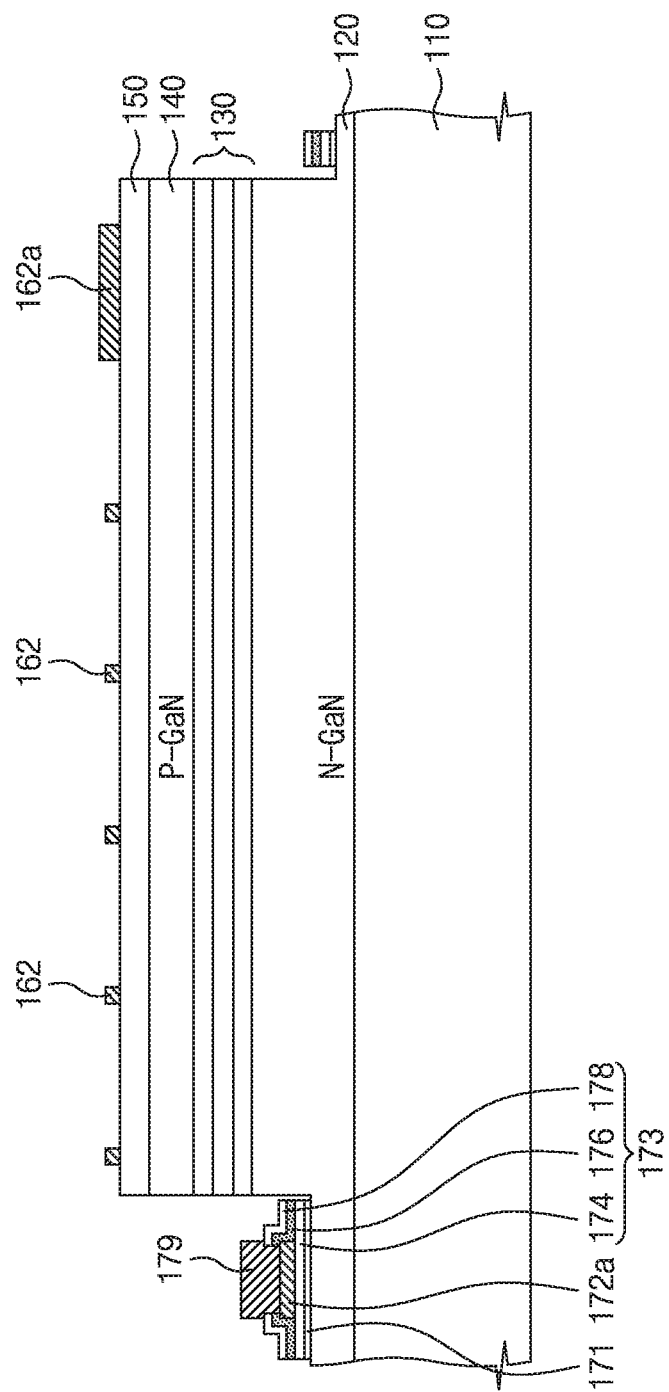

LIGHT-EMITTING DIODE DEVICE FOR ENHANCING LIGHT EXTRACTION EFFICIENCY AND CURRENT INJECTION EFFICIENCY

CROSS-REFERENCE TO RELATED APPLICATIONS

This U.S. non-provisional patent application claims priority under 35 U.S.C. § 119 to Korean Patent Application No. 10-2016-0071679, filed on Jun. 9, 2016, in the Korean Intellectual Property Office, the entire contents of which are hereby incorporated by reference.

BACKGROUND OF THE INVENTION

The present disclosure relates to a light-emitting diode (LED) device, and in particular, to an LED device, which has a structure of transparent metal oxide/metal/transparent metal oxide for enhancing light extraction efficiency and current injection efficiency, and which is provided with current injection electrodes for increasing current injection efficiency.

Electron-hole recombination may occur at a junction region of p- and n-type semiconductor materials, when an electric current is provided to the junction region. A light emitting diode (LED) is a semiconductor device that is configured to generate light using such electron-hole recombination.

The LED device, which is one of III-V nitride-based semiconductor devices, has been evolved from a lateral structure to a flip-chip or vertical structure allowing for a high brightness property. Especially, in the field of vehicle lighting, the vertical LED device has been actively developed to realize a high brightness property under high-power and high-temperature environment.

For the lateral and vertical LED devices, in order to improve the light extraction efficiency, there have been many studies on material and structure of a device or electrode.

GaN-based LED devices may be classified into three types: (a) top-emission type, (b) flip-chip type, and (c) vertical type. In all of the LED devices, some characteristics (e.g., low contact resistance, uniform current spreading, efficient thermal emission property, and high light extraction efficiency) are required, regardless of their types and structures.

According to a conductivity type of a semiconductor material, a material, which has an increased carrier concentration or has a work function higher or lower than that of the semiconductor material, may be used for electrodes of an LED device. In this case, it may be possible to lower a Schottky barrier at an interface between the semiconductor material and the electrode or to reduce a width of a depletion area.

In the case of the top-emission or vertical type LED device, photons produced in an active layer should be emitted to the outside of the device through a current spreading layer thereon. Current spreading, transparency, and current injection efficiency are parameters directly affecting performance of such LED devices. Accordingly, it is necessary to increase optical transmittance and electric conductivity of an upper electrode, in a p- or n-type GaN semiconductor device.

Conventionally, the upper electrode may be formed using a process for forming an electrode pad, on which a wire bonding process will be performed. However, the upper electrode may be provided in the form of a grid or comb. The upper electrode may be formed of at least one of opaque metallic materials (e.g., Cr, Al, Ni, or Au), thereby reducing light extraction efficiency.

According to some embodiments of the inventive concept, an upper electrode pad and an upper electrode may be formed to be spaced apart from each other, and the electrode and current spreading layer or the electrode itself may be formed to have a structure of highly transparent metal oxide/metal/metal oxide. This may make it possible to improve light extraction efficiency of the LED device According to some embodiments of the inventive concept, a transparent upper electrode and a plurality of dot-shaped upper current injection electrodes may be used to improve light extraction efficiency and current injection efficiency of an LED device.

SUMMARY

Some embodiments of the inventive concept provide a lateral or vertical LED device, in which an n or p electrode is replaced with a metal oxide/metal/metal oxide (O/M/O) structure allowing for high light extraction efficiency.

The O/M/O structure may be transparent to blue and green light and may be used to realize high transmittance. In addition, the O/M/O structure may have a significantly low sheet resistance, compared to a typical transparent electrode (e.g., ITO) of the same thickness.

To improve light extraction efficiency of an LED device, various structures for a pad and an electrode have been studied. To minimize an area of an electrode and improve a current spreading phenomenon, there have been various studies on a mesh electrode structure. However, if the electrode is formed of a metallic material, it is not free from a light absorption issue.

The electrode should be provided to form a low resistance ohmic contact with a current spreading layer. Since carriers (i.e., electrons) in an n electrode have high mobility, a transparent material (e.g., ITO, ZnO, AZO, and so forth) may be used for the n electrode, even if it has a relatively high resistance. By contrast, carriers (i.e., holes) in a p electrode may have relatively low mobility. Thus, the p electrode may be formed of a highly conductive material (e.g., metallic materials, such as Cr, Ti, and Al), which can easily form an ohmic contact with the current spreading layer and the semiconductor layer, although such a material is generally opaque. Since such materials are opaque, the electrode may prevent light from being emitted therethrough and may lead to deterioration in light extraction efficiency of an LED device.

The O/M/O structure may be transparent, thereby having high transmittance. In addition, the O/M/O structure may have a significantly low sheet resistance, compared to a transparent electrode (e.g., ITO) of the same thickness. The O/M/O structure may have a bad current injection property, although it allows to realize a good current spreading effect. In the case where opaque current injection electrodes are provided in the form of a plurality of dots, the current injection property of the O/M/O structure can be improved.

According to some embodiments of the inventive concept, a GaN light-emitting diode (LED) device may include a substrate, an n-type GaN layer stacked on the substrate, an active layer stacked on the n-type GaN layer, a p-type GaN layer stacked on the active layer, a current spreading layer stacked on the p-type GaN layer, the current spreading layer including a transparent conductive metal oxide material, a plurality of upper current injection electrodes provided on the current spreading layer to be spaced apart from each other, an upper electrode pattern extending to cover the upper current injection electrodes, and an upper electrode pad electrically connected to the upper electrode pattern. The upper electrode pattern may include a first upper electrode pattern and a second upper electrode pattern, which are sequentially stacked, the first upper electrode pattern may be a thin layer made of silver (Ag) or silver alloy, and the second upper electrode pattern may include a thin layer made of a transparent conductive metal oxide material.

In some embodiments, the upper current injection electrodes may be formed of Ti, Al, Cr, Au, Ti/Al, Cr/Al/Ti/Au, or Cr/Ni/Au.

In some embodiments, the current spreading layer may have a thickness ranging from 10 nm to 50 nm, the first upper electrode pattern may have a thickness ranging from 15 nm to 20 nm, and the second upper electrode pattern may have a thickness ranging from 10 nm to 50 nm.

In some embodiments, the current spreading layer and the second upper electrode pattern may include at least one of indium tin oxide (ITO), ZnO, $Sn_2O_3$, $TiO_2$, or indium gallium zinc oxide (IGZO).

In some embodiments, the device may further include an auxiliary upper current injection electrode provided below the upper electrode pad.

In some embodiments, the device may further include a current blocking layer provided between the upper electrode pad and the current spreading layer.

In some embodiments, the device may further include a lower electrode pattern provided in an etched region of the n-type GaN layer to be in contact with the n-type GaN layer, and a lower electrode pad provided to be in electric contact with the lower electrode pattern. The lower electrode pattern may include a first lower electrode pattern provided on the n-type GaN layer, a second lower electrode pattern provided on the first lower electrode pattern, and a third lower electrode pattern provided on the second lower electrode pattern. The second lower electrode pattern may be a thin layer formed of silver or silver alloy, and the first lower electrode pattern and the third lower electrode pattern may be a thin layer formed of a transparent conductive metal oxide material.

In some embodiments, the device may further include a plurality of lower current injection electrodes, which are provided between the first lower electrode pattern and the second lower electrode pattern and are spaced apart from each other.

In some embodiments, the device may further include an ohmic contact pattern provided between the lower electrode pattern and the exposed n-type GaN layer.

According to some embodiments of the inventive concept, a GaN light-emitting diode (LED) device may include a p electrode, a p-type GaN layer provided on the p electrode, an active layer provided on the p-type GaN layer, an n-type GaN layer provided on the active layer, a current spreading layer provided on the n-type GaN layer, the current spreading layer including a transparent conductive metal oxide material, a plurality of upper current injection electrodes provided on the current spreading layer to be spaced apart from each other, an upper electrode pattern extending to cover the upper current injection electrodes, and an upper electrode pad electrically connected to the upper electrode pattern. The upper electrode pattern may include a first upper electrode pattern and a second upper electrode pattern, which are sequentially stacked, the first upper electrode pattern may be a thin layer made of silver (Ag) or silver alloy, and the second upper electrode pattern may include a thin layer made of a transparent conductive metal oxide material.

In some embodiments, the upper current injection electrodes may have a layered structure of Ti, Al, Cr, Au, Ti/Al, Cr/Al/Ti/Au, or Cr/Ni/Au.

In some embodiments, the current spreading layer may have a thickness ranging from 10 nm to 50 nm, the first upper electrode pattern may have a thickness ranging from 15 nm to 20 nm, and the second upper electrode pattern may have a thickness ranging from 10 nm to 50 nm.

In some embodiments, the current spreading layer and the second upper electrode pattern may include at least one of indium tin oxide (ITO), ZnO, $Sn_2O_3$, $TiO_2$, or indium gallium zinc oxide (IGZO).

In some embodiments, the device may further include an auxiliary upper current injection electrode provided below the upper electrode pad.

According to some embodiments of the inventive concept, a GaN light-emitting diode (LED) device may include an n-type GaN layer, an active layer stacked on the n-type GaN layer, a p-type GaN layer stacked on the active layer, an n electrode used to apply a current to the n-type GaN layer, and a p electrode used to apply a current to the p-type GaN layer. The n electrode or the p electrode may include a first transparent conductive metal oxide layer, a metal layer stacked on the transparent conductive metal oxide layer, and a second transparent conductive metal oxide layer stacked on the metal layer. Metallic current injection electrodes may be provided between the first transparent conductive metal oxide layer and the metal layer and may be spaced apart from each other in an extension direction of the n or p electrode.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 1D is a sectional view taken along line C-C' of FIG. 1A.

FIGS. 2A to 2I are sectional views illustrating a method of fabricating a lateral LED device of FIG. 1A.

Figure 1A:
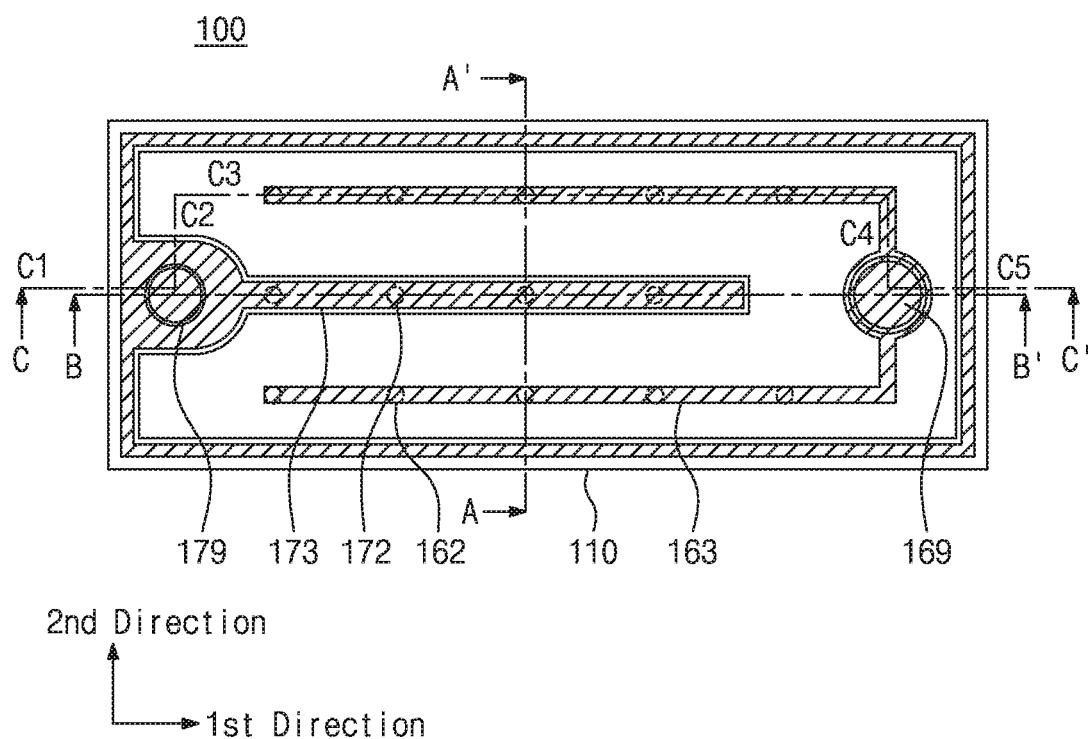
FIG. 1A is a plan view illustrating a GaN light-emitting diode device according to some embodiments of the inventive concept.

It should be noted that these figures are intended to illustrate the general characteristics of methods, structure and/or materials utilized in certain example embodiments and to supplement the written description provided below.

These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or to identical reference numbers in the various drawings is intended to indicate the presence of a similar or identical element or feature.

DETAILED DESCRIPTION

In a metal oxide/metal/metal oxide (O/M/O) structure, a material with high refractive index (e.g., ITO, $TiO_2$, $SnO_2$, ZnO, AZO, or $Y_2O_3$) is used as the metal oxide layer, and a material (e.g., silver (Ag) or silver alloys) having a low absorption coefficient for visible light is used as the metal layer. By controlling a thickness of each of the metal oxide layer and the metal layer, it may be possible to realize high transmittance within a specific wavelength range (e.g., red, green, or blue).

In the lateral LED, a transparent conductive metal oxide layer of the O/M/O structure may be used as a part of a current spreading layer that is directly provided under a p electrode. In some embodiments, ITO, $SnO_2$, or ZnO may be used as the transparent conductive metal oxide material. Thus, in the case where the O/M/O structure is used to replace the p electrode, a transparent conductive metal oxide layer, which is positioned at the lowermost level in the O/M/O structure, may be used as the current spreading layer.

According to some embodiments of the inventive concept, in the case where the O/M/O structure is used as an n electrode of a lateral or vertical LED device, three layers may be used. Here, an ohmic contact layer, which is formed of a material having a small work function (e.g., Ti, Cr, Al, or W), may be further provided below the O/M/O structure to be in ohmic contact with an n-type semiconductor layer.

According to some embodiments of the inventive concept, since an electrode having the O/M/O structure is transparent, there is no limitation on its thickness or the number of electrode fingers. The thicker the electrode or the more the fingers, the better the current spreading effect.

The O/M/O structure has low sheet resistance, allowing for effective current spreading. However, there is a difficulty in performing a current injection through the O/M/O structure. For example, a current may not be injected to an end of an electrode of an LED device, and this may lead to a difficulty in emitting light through an entire surface. Accordingly, light extraction efficiency of the LED device may be deteriorated.

According to some embodiments of the inventive concept, dot-shaped low-resistance current injection electrodes are provided along and between the electrodes having the O/M/O structure, it may be possible to inject a current to the end of the electrode. Although the current injection electrodes are opaque, the O/M/O electrode, other than the current injection electrodes, may be transparent. Accordingly, the light extraction efficiency of the device may be increased.

The current injection electrodes may be provided in such a way that a space therebetween is decreased in a direction toward an end of the electrode finger, and this may make it possible to uniformly supply a current throughout the electrode finger.

According to some embodiments of the inventive concept, the O/M/O electrode with the current injection electrodes may be applied to an n electrode and to both of the lateral and vertical LED devices.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1A is a plan view illustrating a GaN light-emitting diode device according to some embodiments of the inventive concept.

Figure 1B:
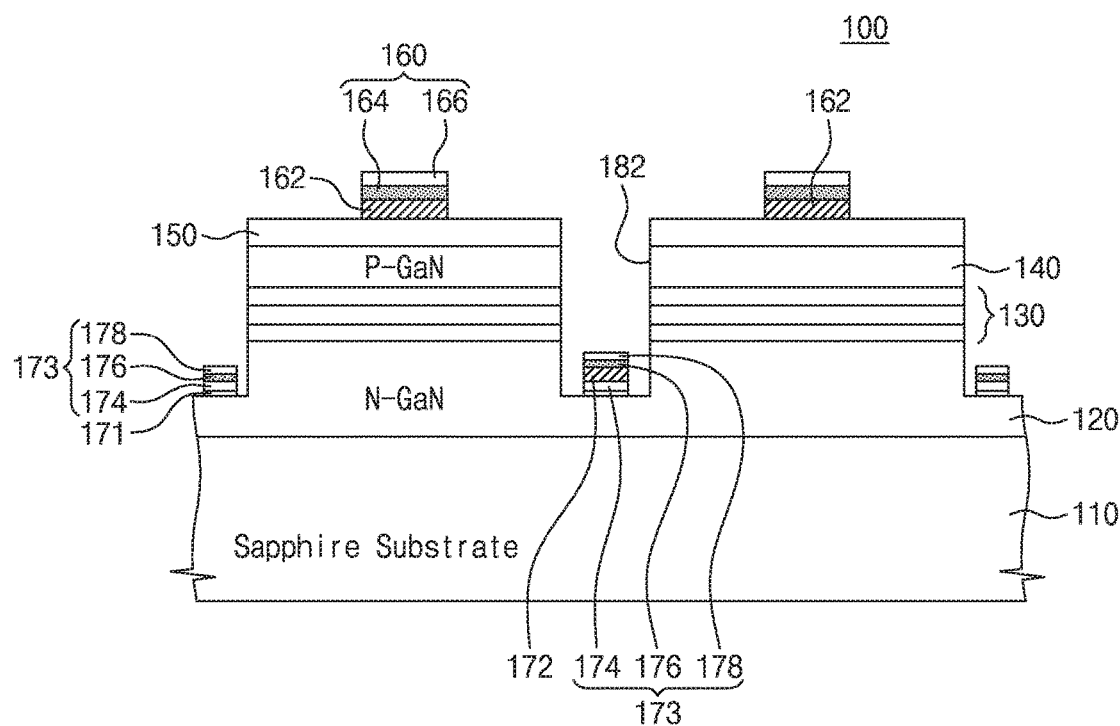
FIG. 1B is a sectional view taken along line A-A' of FIG. 1A.

FIG. 1B is a sectional view taken along line A-A' of FIG. 1A.

Figure 1C:
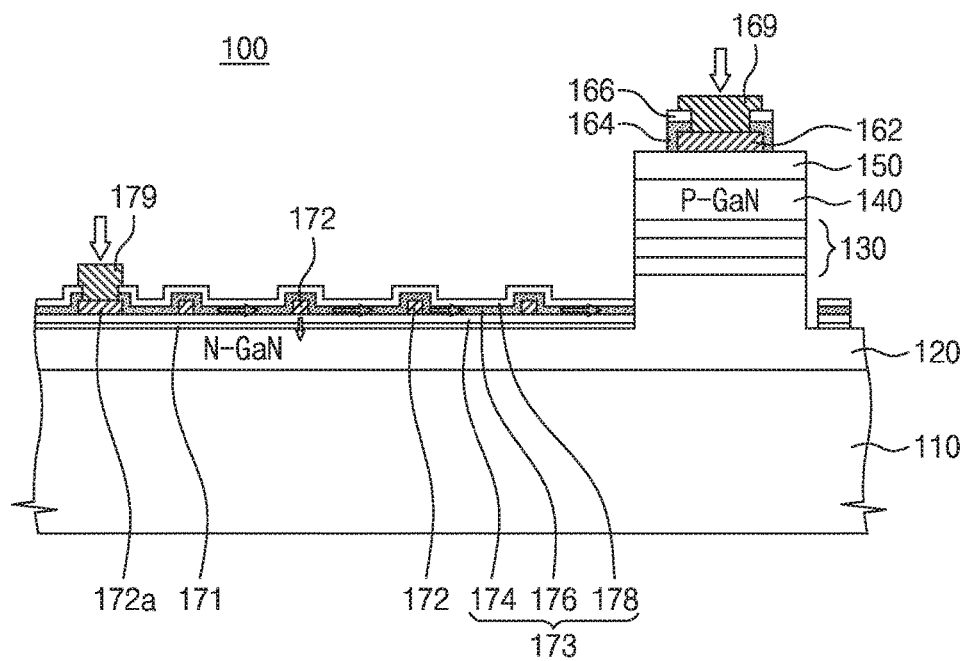
FIG. 1C is a sectional view taken along line B-B' of FIG. 1A.

FIG. 1C is a sectional view taken along line B-B' of FIG. 1A.

FIG. 1D is a sectional view taken along line C-C' of FIG. 1A.

Referring to FIGS. 1A to 1D, a GaN light-emitting diode (LED) device 100 may include a substrate 110, an n-type GaN layer 120 stacked on the substrate 110, an active layer 130 stacked on the n-type GaN layer 120, a p-type GaN layer 140 stacked on the active layer 130, a current spreading layer 150 stacked on the p-type GaN layer 140, the current spreading layer 150 including transparent conductive metal oxide, a plurality of upper current injection electrodes 162, which are provided on the current spreading layer 150 to be spaced apart from each other, an upper electrode pattern 163, which extends to cover the upper current injection electrodes 162, and an upper electrode pad 169, which is electrically connected to the upper electrode pattern 163.

The upper electrode pattern 163 may include a first upper electrode pattern 164 and a second upper electrode pattern 166, which are stacked on the upper current injection electrodes 162. The first upper electrode pattern 164 may be a thin layer made of silver (Ag) or silver alloy, and the second upper electrode pattern 166 may include a transparent conductive thin layer that is formed of at least one of metal oxides.

The substrate 110 may be a c-plane sapphire substrate, a GaN substrate, or a silicon carbide (SiC) substrate. To reduce crystal defects or dislocations of the sapphire substrate caused by lattice mismatch, a GaN buffer layer (not shown) may be formed on the sapphire substrate.

The n-type GaN layer 120 may be grown on the GaN buffer layer to have a large thickness of several micrometers. N-type impurities may be silicon (Si).

The active layer 130 may be deposited on the n-type GaN layer 120. The active layer 130 may be provided to have a structure of a double heterostructure, a single quantum well, or multiple quantum wells. In the case of a blue or green LED device, the multiple quantum wells may be an InGaN/GaN structure. In the case of ultraviolet light, the multiple quantum wells may be an AlGaN/InGaN structure.

An electron blocking layer may be additionally provided on the active layer 130. In the electron blocking layer (not shown), an electron leakage current may be greater than a hole leakage current, and this may make it possible to protect an electron current. The electron blocking layer may be an AlGaN layer.

The p-type GaN layer 140 may be formed on the electron blocking layer or the active layer 130. P-type impurities may be magnesium (Mg).

A current spreading layer (or an electron spreading layer) may be provided on the p-type GaN layer 140. The current spreading layer 150 may be formed of or include a transparent conductive metal oxide. The current spreading layer 150 may be used to uniformly supply a current to the p-type GaN layer 140 and to allow light to be emitted from the entire surface of the active layer 130. In general, indium thin oxide (ITO) may be widely used as the current spreading layer 150. Preferably, the current spreading layer 150 may have a highly transparent property and a sufficiently low sheet resistance property, and moreover, it may be configured to be in ohmic contact with the p-type GaN layer 140. In the case where the thickness of the current spreading layer 150 is increased to reduce resistance of the current spreading layer 150, it may be possible to improve a current spreading property of the current spreading layer 150, but transparency of the current spreading layer 150 may be deteriorated. That is, it may be difficult to improve both of the transparency and the current spreading property of the current spreading layer 150.

A plurality of upper current injection electrodes 162 may be provided on the current spreading layer 150. The upper current injection electrodes 162 may be formed of an opaque metallic material and may be provided in the form of a plurality of micrometer-sized metallic dots. The upper current injection electrodes 162 may be arranged along an electrode wire and may be spaced apart from each other by a predetermined distance. The upper current injection electrodes 162 may be disposed between the lower transparent conductive metal oxide layer (or the current spreading layer) and the metal layer, in the O/M/O structure. The upper current injection electrodes 162 may contribute to increase the current injection efficiency at their respective positions. The upper current injection electrodes 162 may have a circular or polygonal shape and may be arranged along an extension direction of the upper electrode pattern to be spaced apart from each other. The upper current injection electrodes 162 may be formed of or include Ti, Al, Cr, Au. Ti/Al, Cr/Al/Ti/Au, or Cr/Ni/Au. The number of the upper current injection electrodes 162 may be suitably selected in such a way that the total area of the upper current injection electrodes is less than 50% of an area of the upper electrode pattern. A width and a length of the upper current injection electrode 162 may be smaller than a width of the upper electrode pattern 163. The upper current injection electrodes 162 may be arranged along the upper electrode pattern 163 and in the first direction.

In the case where an upper electrode is provided on the current spreading layer, the upper electrode may be generally formed of a metallic material and may serve not only as the electrode, but also as an electrode pad for a wire connection. However, in this case, since the electrode is not transparent, it may lead to deterioration in light extraction efficiency. Accordingly, it may be necessary to develop a novel electrode structure capable of increasing light extraction efficiency.

The upper electrode pattern 163 may be a line pattern that is extended to sequentially cover the upper current injection electrodes 162. The upper electrode pattern 163 may be formed to have a comb-like shape on the current spreading layer 150, and thus, it may be used to uniformly distribute a current. The upper electrode pattern 163 may be configured to have sufficiently low sheet resistance and sufficiently high transparency.

In detail, the current spreading layer 150 may be formed to have a sufficiently small thickness of several ten nanometers, thereby having sufficiently high transparency. To improve a current spreading property of the current spreading layer 150, the upper electrode pattern 163 may be provided on the current spreading layer 150. The upper electrode pattern 163 may have a transparent multi-layered structure. The upper electrode pattern 163 may include a first upper electrode pattern 164 and a second upper electrode pattern 166 which are sequentially stacked on the current spreading layer 150. The first upper electrode pattern 164 may be a sufficiently thin layer formed of silver (Ag) or silver alloy, thereby having a consequently sufficiently transparency, and the second upper electrode pattern 166 may be formed of or include a transparent conductive metal oxide thin layer. The silver alloy may be an aluminum-silver alloy. The first upper electrode pattern 164 may be interposed between the second upper electrode pattern 166 and the current spreading layer 150, thereby forming an O/M/O sandwich structure.

In other words, the current spreading layer 150 and the upper electrode pattern 163 may have a metal oxide/metal/metal oxide (O/M/O) structure. Accordingly, the upper electrode pattern 163 and the current spreading layer 150 thereunder may provide a low sheet resistance and provide transparency to blue and green light. The current spreading layer 150 and the second upper electrode pattern 166 may be formed of or include at least one of indium tin oxide (ITO), ZnO, $Sn_2O_3$, $TiO_2$, or indium gallium zinc oxide (IGZO). A thickness of the current spreading layer 150 may range from 10 nm to 50 nm, a thickness of the first upper electrode pattern 164 may range from 15 nm to 20 nm, and a thickness of the second upper electrode pattern 166 may range from 10 nm to 50 nm. That is, in a region without the upper electrode pattern 163, the current spreading layer may have a sufficiently low thickness (e.g., less than 20 nm), allowing for sufficiently high transparency. In a region with the upper electrode pattern 163, the O/M/O structure may make it possible to realize high transmittance (e.g., of 85% or higher) within a desired wavelength range. In addition, the O/M/O structure may be used to realize a sufficiently low sheet resistance property and a current spreading effect. Accordingly, it may be possible to improve light extraction efficiency of an LED device. The upper current injection electrodes 162 may be spaced apart from each other, may be interposed between the current spreading layer 150 and the first upper electrode pattern 164, and may be used to inject or supply a current to the current spreading layer and p-type GaN layer 140 thereunder.

The upper electrode pad 169 may be electrically connected to the upper electrode pattern 163. In a plan view, the upper electrode pad 169 may be placed at the right side. The upper electrode pad 169 may be formed of or include Ti, Al, Cr, Au, Ti/Al, Ni/Au, Cr/Al/Ti/Au, or Cr/Ni/Au. The upper electrode pad 169 may be connected to an external circuit through a wiring structure. The upper electrode pad 169 may be provided to realize an electric wiring structure, and the upper electrode pad 169 may be a Cr/Al/Ni/Au structure, a Cr/Ni/Au structure, or a Ni/Au structure.

An auxiliary upper current injection electrode 162a may be further provided below the upper electrode pad 169. The auxiliary upper current injection electrode 162a may have the same structure as the upper current injection electrode 162.

A lower electrode pattern 173 may be provided in an etched portion of the n-type GaN layer 120. In some embodiments, the lower electrode pattern 173 may be in direct contact with the n-type GaN layer 120, or an ohmic contact pattern 171 may be interposed between the lower electrode pattern 173 and the n-type GaN layer 120. The lower electrode pattern 173 may be provided on the n-type GaN layer exposed by a mesa etching. The lower electrode pattern 173 may be provided in a trench 182 extending in the first direction. In addition, the lower electrode pattern 173 may be provided along an edge of the LED device.

The lower electrode pattern 173 may include a first lower electrode pattern 174 disposed on the n-type GaN layer 120, a second lower electrode pattern 176 disposed on the first lower electrode pattern 174, and a third lower electrode pattern 178 disposed on the second lower electrode pattern 176. The first lower electrode pattern 174, the second lower electrode pattern 176, and the third lower electrode pattern 178 may be provided in the form of a line pattern and may be vertically aligned to each other.

The second lower electrode pattern 176 may be a thin layer made of silver or silver alloy, and the first and third lower electrode patterns 174 and 178 may be a thin layer made of transparent conductive metal oxide.

The trench 182 may be formed to wholly penetrate the p-type GaN layer 140 and the active layer and to partially penetrate the n-type GaN layer 120. The lower electrode pattern 173 may be provided in the trench 182 and the n-type GaN layer 120.

A lower electrode pad 179 may have a Ti/Al structure or a Ti/Al/Ni/Au structure. The lower electrode pad 179 may be provided to be in electric contact with the lower electrode pattern 173. The lower electrode pad 179 may be electrically connected to an external circuit through a wire.

A plurality of lower current injection electrodes 172 may be provided between the first lower electrode pattern 174 and the second lower electrode pattern 176 and may be spaced apart from each other in the first direction. The lower current injection electrodes 172 may be arranged spaced apart from each other in an extension direction (i.e., the first direction) of the lower electrode pattern 173.

The lower current injection electrode 172 may be provided in only the lower electrode pattern 173 extending along a bottom surface of the trench 182, which is formed to cross a center of the LED device 100 in the first direction, and in the first direction. The lower current injection electrodes 172 may have a size that is smaller than a width of the lower electrode pattern 173.

The ohmic contact pattern 171 may be provided between the n-type GaN layer 120 and the lower electrode pattern 173. Accordingly, the ohmic contact pattern 171 may be a line pattern aligned to the lower electrode pattern 173. The ohmic contact pattern 171 may be formed of at least one of materials (e.g., Ti, Cr, Al, or W) having small work functions.

An auxiliary lower current injection electrode 172a may be further provided below the lower electrode pad 179. The auxiliary lower current injection electrode 172a and the lower current injection electrode 172 may be formed to have the same structure and may be formed at the same time. At a region provided with the lower electrode pad 179, a structure of ohmic contact pattern/first lower electrode pattern/lower current injection electrode-lower electrode pad may be provided. At a region provided with the lower current injection electrode 172, a structure of ohmic contact pattern/first lower electrode pattern/lower current injection electrode/second lower electrode pattern/third lower electrode pattern may be provided.

FIGS. 2A to 2I are sectional views illustrating a method of fabricating a lateral LED device of FIG. 1A.

Referring to FIG. 2A, an n-type GaN layer 120, an active layer 130, and a p-type GaN layer 140 may be formed on a substrate 110. Each of the semiconductor layers may be formed by an MOCVD method. A current spreading layer 150 may be deposited on the substrate provided with the p-type GaN layer 140. The current spreading layer 150 may be a transparent conductive metal oxide layer.

A mesa etching process using a mask may be performed on the current spreading layer 150, the p-type GaN layer 140, and the active layer 130 to expose the n-type GaN layer 120. In some embodiments, the mesa etching process may be performed to form a trench 182 extending in a first direction and an edge region of the LED device.

Referring to FIG. 2B, an ohmic contact pattern 171 may be formed on an exposed portion of the n-type GaN layer 120 using a lift-off process. The ohmic contact pattern 171 may be a line pattern extending along the trench 182.

Figure 2C:
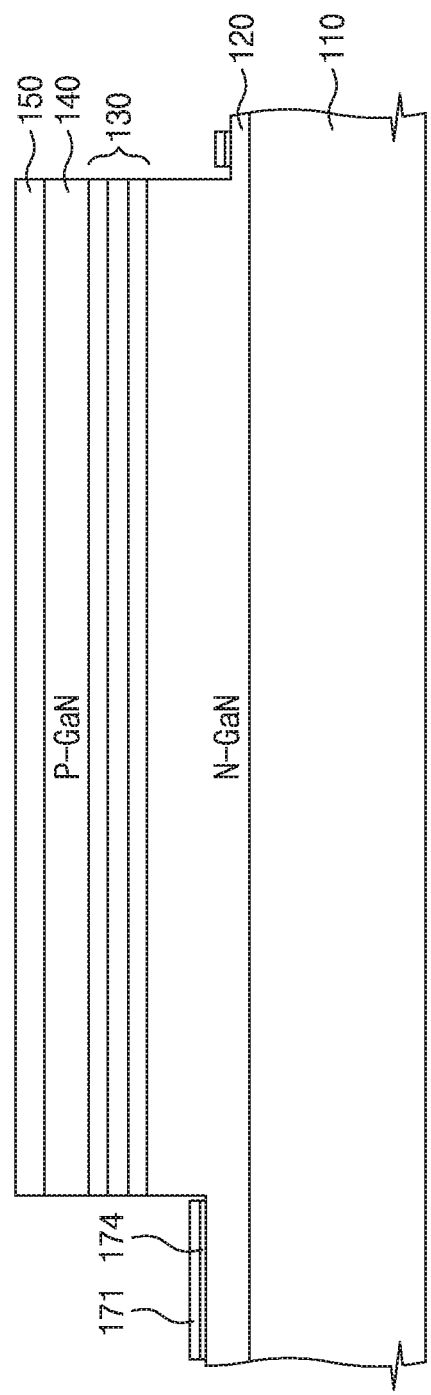

Referring to FIG. 2C, a first lower electrode pattern 174 may be formed on the ohmic contact pattern 171 using a lift-off process. The first lower electrode pattern 174 may be formed of a transparent conductive metal oxide.

Figure 2D:
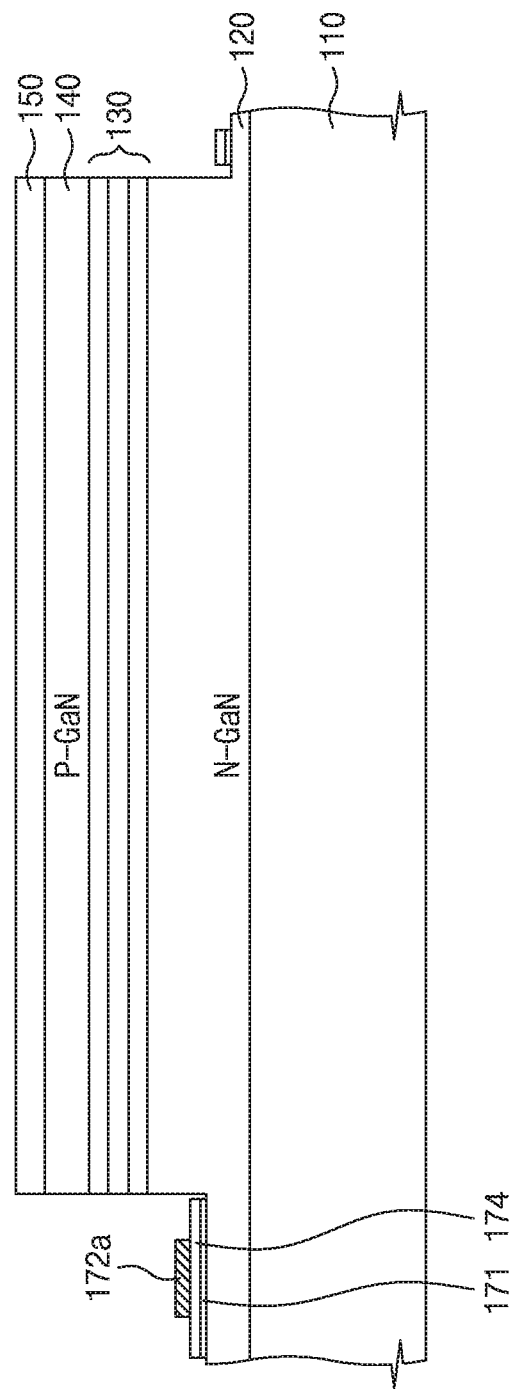

Referring to FIG. 2D, an auxiliary lower current injection electrode 172a and lower current injection electrodes 172 may be formed on the first lower electrode pattern 174 using a lift-off process. The auxiliary lower current injection electrode 172a may be aligned to a lower electrode pad 179 to be formed in a subsequent process. The lower current injection electrodes 172 may be arranged along the ohmic contact pattern 171 or the first lower electrode pattern 174 and may be spaced apart from each other by a predetermined distance. For example, the lower current injection electrodes 172 may be provided in the trench and may be arranged along the first lower electrode pattern 174 to be spaced apart from each other by the same distance.

Figure 2E:
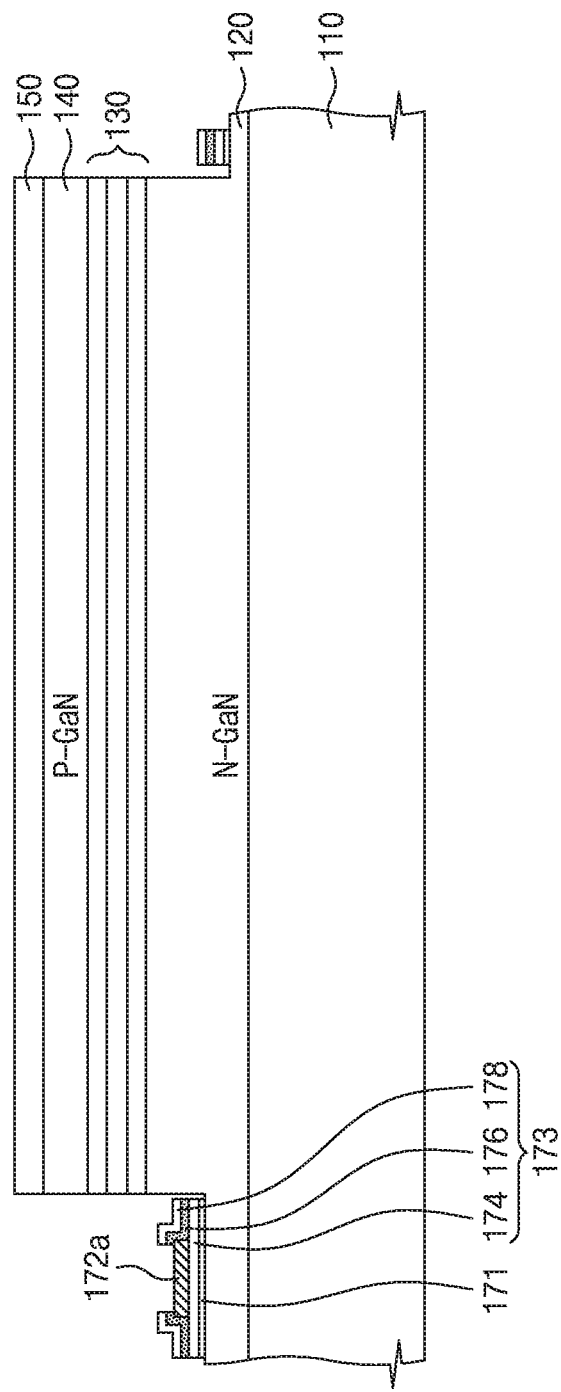

Referring to FIG. 2E, a second lower electrode pattern 176 may be formed on the first lower electrode pattern 174 and the lower current injection electrodes 172 using a lift-off process. The second lower electrode pattern 176 may not be formed on the auxiliary lower current injection electrode 172a. The second lower electrode pattern 176 may be formed of or include silver or silver alloy.

Thereafter, a third lower electrode pattern 178 may be formed on the second lower electrode pattern 176 using a lift-off process. The third lower electrode pattern 178 may be formed of or include a transparent conductive metal oxide.

Figure 2F:
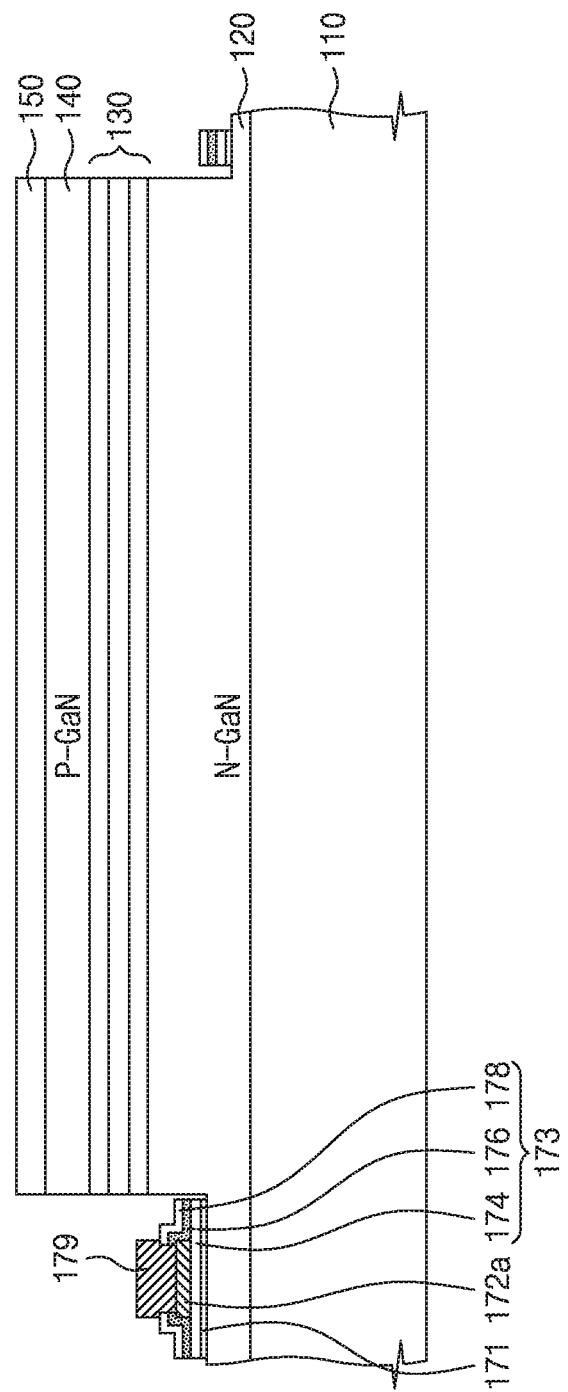

Referring to FIG. 2F, a lower electrode pad 179 may be formed on the auxiliary lower current injection electrode 172a using a lift-off process.

Referring to FIG. 2G, an auxiliary upper current injection electrode 162a and upper current injection electrodes 162 may be formed on the current spreading layer 150 using a lift-off process.

Figure 2H:
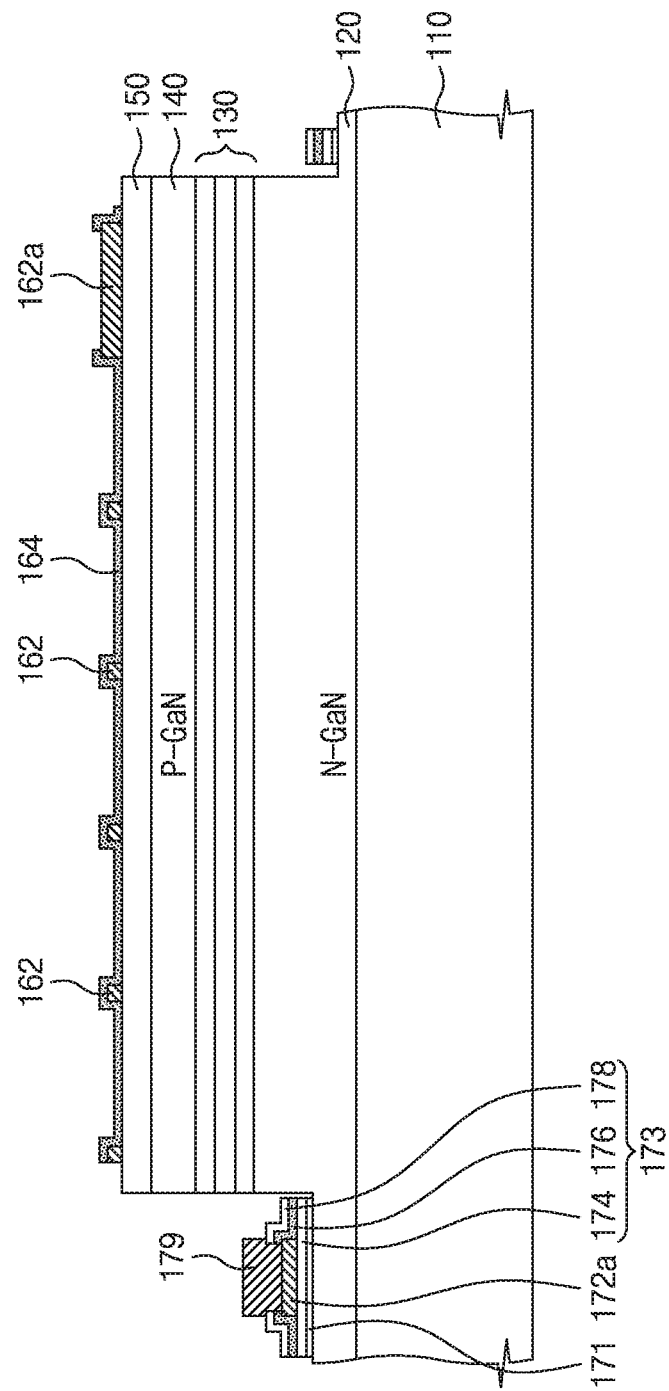

Referring to FIG. 2H, a first upper electrode pattern 164 may be formed using, for example, a lift-off process, to cover the upper current injection electrodes 162. The first upper electrode pattern 164 may be a thin layer made of silver (Ag) or silver alloy. The first upper electrode pattern 164 may include a line pattern extending in a first direction. The first upper electrode pattern 164 may not be formed on the auxiliary lower current injection electrode 162a.

Figure 2I:
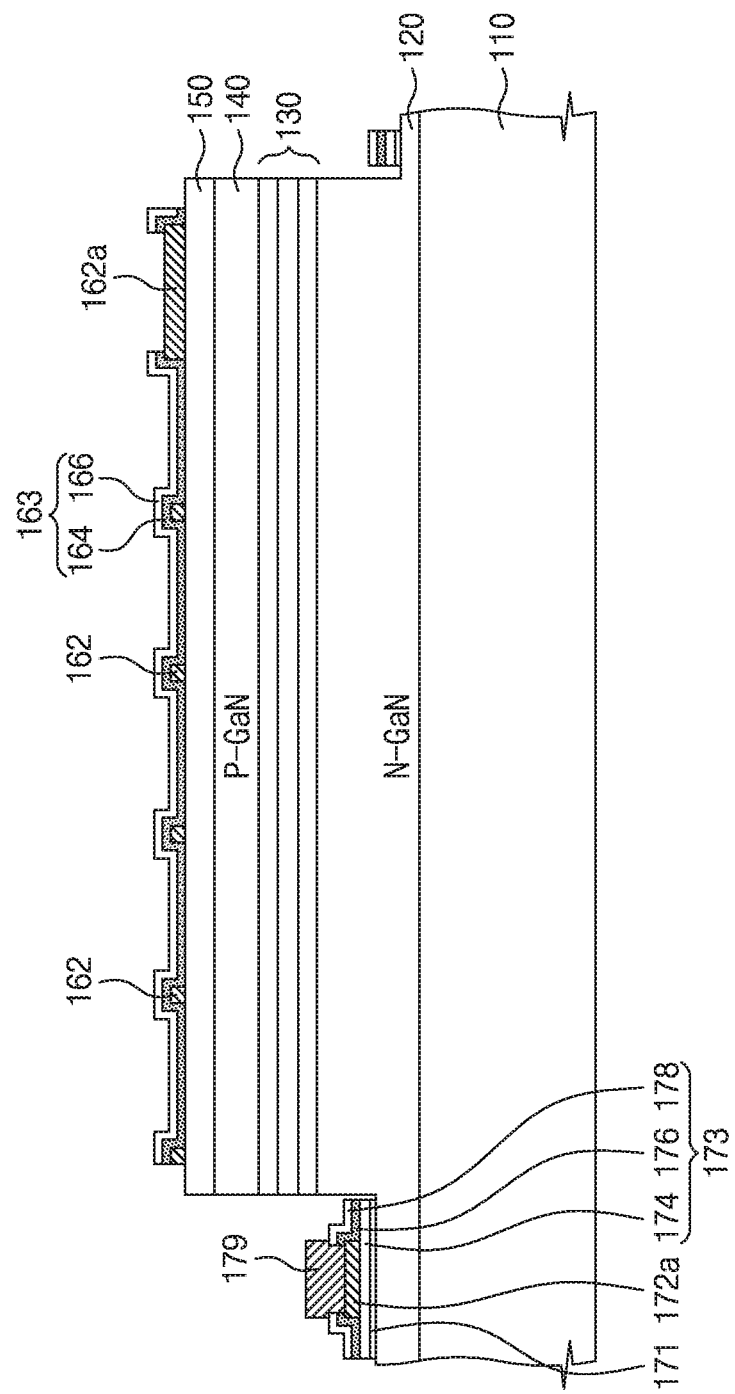

Referring to FIG. 2I, a second upper electrode pattern 166 may be formed on the first upper electrode pattern 164 using a lift-off process. The second upper electrode pattern 166 may not be formed on the auxiliary lower current injection electrode 162a.

Referring back to FIG. 1D, an upper electrode pad 169 may be formed on the auxiliary lower current injection electrode 162a using a lift-off process. In the case where a current is injected into the upper electrode pad 169, a major fraction of the current may flow along the upper electrode pattern 163, but at least a fraction of the current may be injected into the current spreading layer 150 through the lower current injection electrodes 162.

Figure 3:
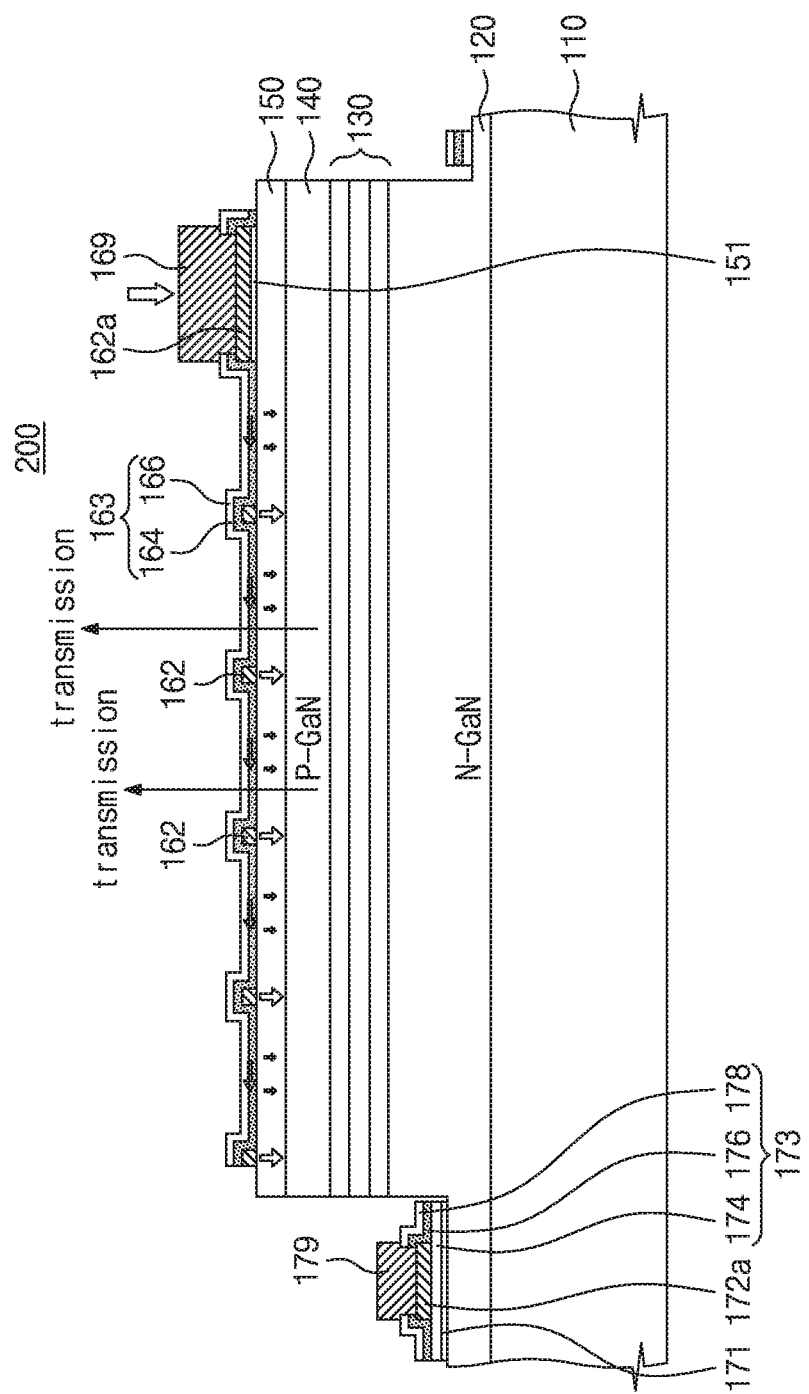
FIG. 3 is a sectional view illustrating a lateral LED device, according to other embodiments of the inventive concept.

FIG. 3 is a sectional view illustrating a lateral LED device, according to other embodiments of the inventive concept.

Referring to FIGS. 1 and 3, a GaN LED device 200 may include an n-type GaN layer 120, an active layer 130 stacked on the n-type GaN layer 120, a p-type GaN layer 140 stacked on the active layer 130, an n electrode 173 which is configured to apply a current to the n-type GaN layer 120, and a p electrode 163 which is configured to apply a current to the p-type GaN layer 140. The n electrode 173 or the p electrode 163 may include a first transparent conductive metal oxide layer, a metal layer stacked on the transparent conductive metal oxide layer, and a second transparent conductive metal oxide layer stacked on the metal layer. Current injection electrodes 162 and 172, each of which is formed of a metallic material, may be provided between the first transparent conductive metal oxide layer and the metal layer to be spaced apart from each other in an extension direction of the n or p electrode. The current injection electrodes 162 and 172 may be formed of or include Ti, Al, Cr, Au, Ti/Al, Cr/Al/Ti/Au, or Cr/Ni/Au.

In certain embodiments, the GaN LED device 200 may include a substrate 110, an n-type GaN layer 120 stacked on the substrate, an active layer 130 stacked on the n-type GaN layer 120, a p-type GaN layer 140 stacked on the active layer 130, a current spreading layer 150 including a transparent conductive metal oxide stacked on the p-type GaN layer 140, a plurality of upper current injection electrodes 162 provided on the current spreading layer 150 to be spaced apart from each other, an upper electrode pattern 163 extending to cover the upper current injection electrodes 162, and an upper electrode pad 169 electrically connected to the upper electrode pattern 163.

A current blocking layer 151 may be disposed between the upper electrode pad 163 and the current spreading layer 150. For example, the current blocking layer 151 may be disposed between the current spreading layer 150 and the auxiliary upper current injection electrode 162a. Accordingly, the current blocking layer 151 may be used to prevent or suppress a current from being injected into a current spreading layer thereunder and to provide the current along the upper electrode pattern 163. The current blocking layer 151 may be a silicon oxide ($SiO_2$) layer or a titanium oxide ($TiO_2$) layer. The current blocking layer 151 may be an insulating layer with high electric resistance and may allow the current to be uniformly spread along an electrode finger. A thickness of the current blocking layer 151 may be equal to or less than several ten nanometers. This may make it possible to realize a spatially uniform current injection.

Figure 4A:
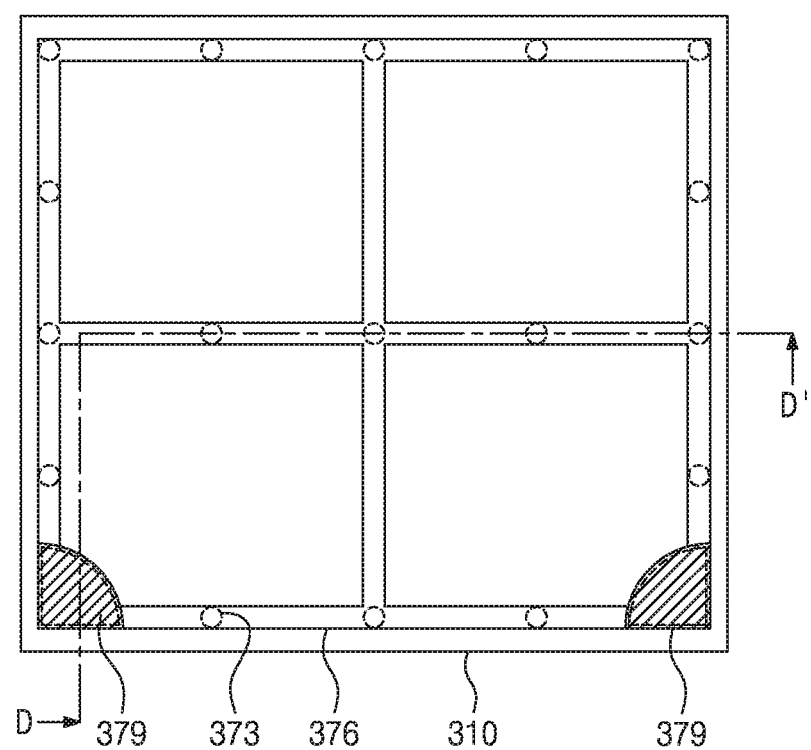
FIG. 4A is a plan view illustrating a vertical LED device, according to still other embodiments of the inventive concept.

FIG. 4A is a plan view illustrating a vertical LED device, according to still other embodiments of the inventive concept.

Figure 4B:
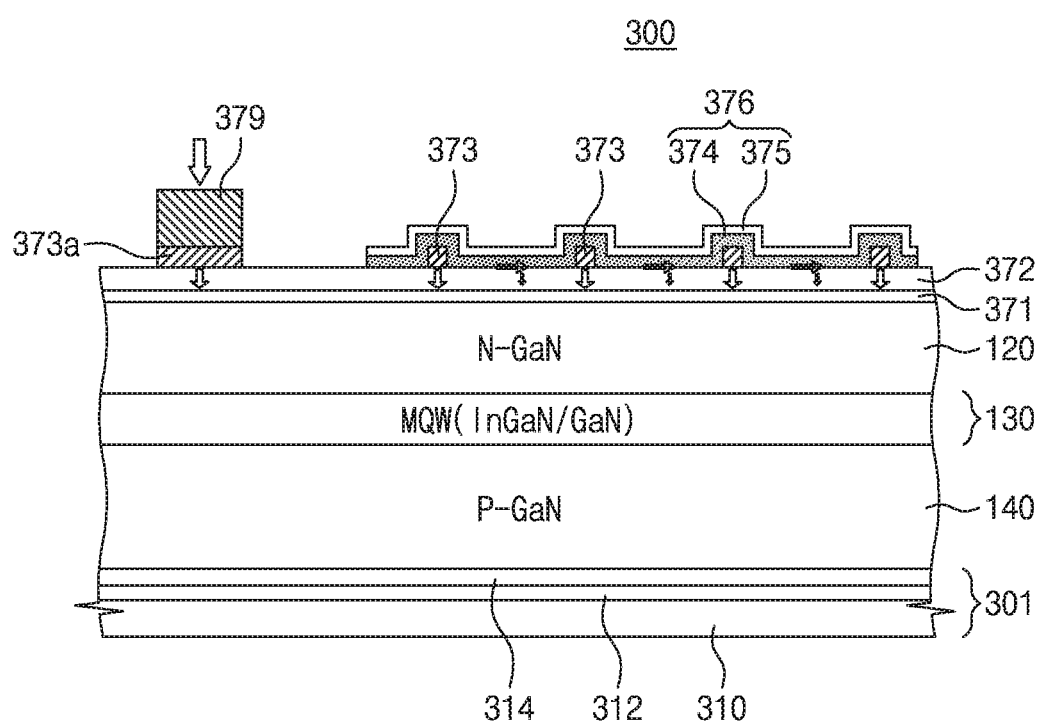
FIG. 4B is a sectional view taken along line D-D' of FIG. 4A.

FIG. 4B is a sectional view taken along line D-D' of FIG. 4A.

Referring to FIGS. 4A and 4B, a vertical LED device 300 may include a p electrode 301, a p-type GaN layer 140 stacked on the p electrode 301, an active layer 130 stacked on the p-type GaN layer 140, an n-type GaN layer 120 disposed on the active layer 130, a current spreading layer 372, which is provided on the n-type GaN layer 120 and includes a transparent conductive metal oxide, a plurality of upper current injection electrodes 373 provided to be spaced apart from each other on the current spreading layer, an upper electrode pattern 376 extending to cover the upper current injection electrodes, and an upper electrode pad 379 electrically connected to the upper electrode pattern 376. The upper electrode pattern 376 may include a first upper electrode pattern 374 and a second upper electrode pattern 376 which are sequentially stacked, the first upper electrode pattern 374 may be a thin layer made of silver (Ag) or silver alloy, and the second upper electrode pattern 376 may include a transparent conductive metal oxide thin layer.

The p electrode 301 may include a conductive substrate 310, a substrate bonding layer 312, and a metal reflection layer 314. The conductive substrate 310 may be a molybdenum substrate, a silicon substrate, a copper substrate, or a substrate made of a molybdenum-copper alloy. The substrate bonding layer 312 may be provided between the conductive substrate and the metal reflection layer. The substrate bonding layer 312 may be formed of or include Au/Sn alloy, Ni/Sn alloy, or Sn-containing alloy. The substrate bonding layer 312 may be bonded to the conductive substrate through a thermal treatment to be performed at a low temperature of about 200° C. The metal reflection layer 314 may be provided on the substrate bonding layer. The metal reflection layer 314 may be formed of or include Ti, Al, Cr. W. or alloys thereof. The metal reflection layer 314 may be used to reflect light emitted from the active layer 130 and to form an ohmic contact.

A p-type GaN layer 140 may be provided on the metal reflection layer 314. P-type impurities may be magnesium (Mg).

An active layer 130 may be provided on the p-type GaN layer 140. The active layer 130 may be provided to have a structure of a double heterostructure, a single quantum well, or multiple quantum wells. In the case of a blue or green LED device, the multiple quantum wells may be an InGaN/GaN structure. In the case of ultraviolet light, the multiple quantum wells may be an AlGaN/InGaN structure.

An n-type GaN layer 120 may be provided on the active layer 130. N-type impurities may be silicon (Si).

An ohmic contact layer 371 may be provided on the n-type GaN layer 120. The ohmic contact layer 371 may be formed of at least one of materials (e.g., Ti, Cr, Al, or W) having small work functions.

A current spreading layer 372 may be provided on the ohmic contact layer 371. The current spreading layer 372 may be formed of or include at least one of indium tin oxide (ITO), ZnO, $Sn_2O_3$, $TiO_2$, or indium gallium zinc oxide (IGZO).

Upper current injection electrodes 373 and an auxiliary upper current injection electrode 373a may be provided on the current spreading layer 372. The upper current injection electrodes 373a may have a structure of Ti, Al, Cr, Au, Ti/Al, Cr/Al/Ti/Au, or Cr/Ni/Au. The auxiliary upper current injection electrode may be simultaneously formed using a process for forming the upper current injection electrodes and may have substantially the same structure as the upper current injection electrode. The upper current injection electrodes 373 may be arranged and aligned in a line, and each of them may have a dot shape.

The upper electrode pattern 376 may be formed to cover the upper current injection electrodes 373 and to expose the auxiliary upper current injection electrode 373a. The upper electrode pattern 376 may include a first upper electrode pattern 374 and a second upper electrode pattern 375. The first upper electrode pattern 374 may be formed of or include silver or silver alloy. The second upper electrode pattern 375 may be formed of or include a transparent conductive metal oxide. For example, the second upper electrode pattern 375 may include at least one of indium tin oxide (ITO), ZnO, $Sn_2O_3$, $TiO_2$, or indium gallium zinc oxide (IGZO). The upper electrode pattern 376 may be a line- or mesh-shaped pattern. A thickness of the current spreading layer 372 may range from 10 nm to 50 nm, a thickness of the first upper electrode pattern 374 may range from 15 nm to 20 nm, and a thickness of the second upper electrode pattern 375 may range from 10 nm to 50 nm.

The upper electrode pad 379 may be electrically connected to the upper electrode pattern 376 and may be connected to an external circuit through a wiring structure. The upper electrode pad 379 may be provided on and aligned to the auxiliary upper current injection electrode 373a. The upper electrode pad 379 may be provided to have a Ti/Al structure or a Ti/Al/Ni/Au structure.

FIGS. 5A to 5F are sectional views illustrating a method of fabricating a vertical GaN LED, according to even other embodiments of the inventive concept.

Figure 5A:
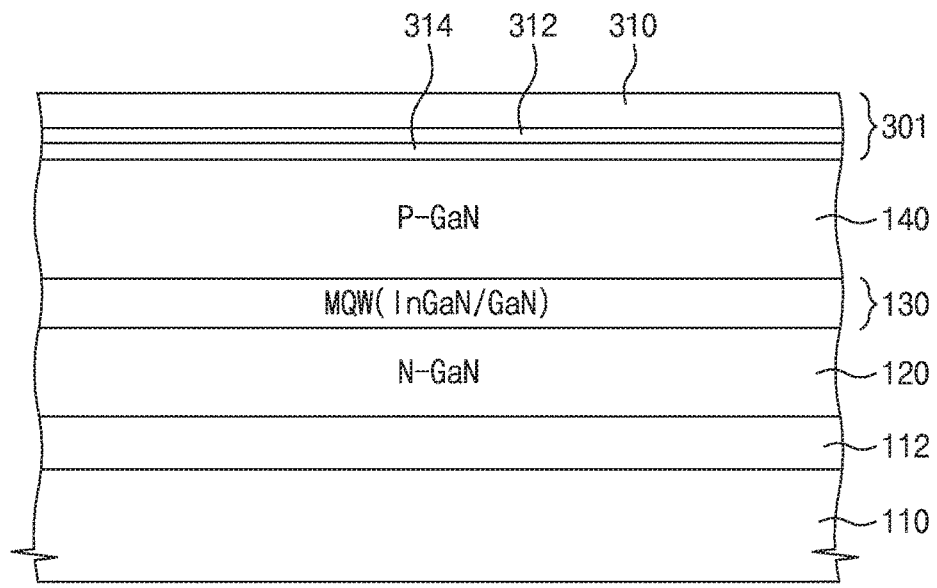
FIGS. 5A to 5F are sectional views illustrating a method of fabricating a vertical GaN LED, according to even other embodiments of the inventive concept.

Referring to FIG. 5A, the vertical LED device 300 may be fabricated using a laser lift-off technology. For example, a sapphire substrate 110 may be prepared. A buffer layer 112 and an n-type GaN layer 120 may be sequentially formed on the sapphire substrate 110. An active layer 130 may be formed on the n-type GaN substrate. The active layer 130 may be formed to have a multiple quantum well structure. For example, GaN/InGaN multiple quantum wells may be grown using a metal-organic chemical vapor deposition (MOCVD) process. Thereafter, a p-type GaN layer 140 may be formed on the active layer. Next, a p electrode 301 may be formed to cover the entire top surface of the p-type GaN layer 140.

The p electrode 301 may include a metal reflection layer 314, a substrate bonding layer 312, and a conductive substrate 310, which are sequentially stacked on the p-type GaN layer 140.

Figure 5B:
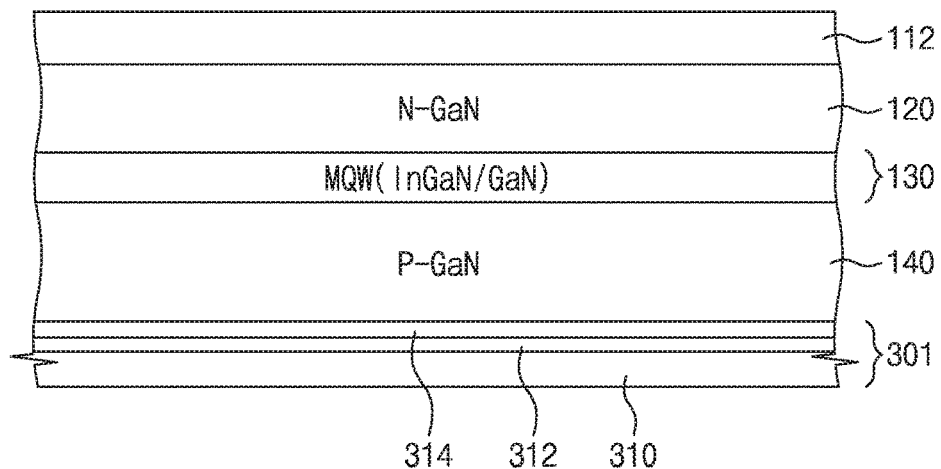

Referring to FIG. 5B, if the sapphire substrate 110 is irradiated with a laser beam, the laser beam may pass through the sapphire substrate and may be absorbed between the n-type GaN layer 120 and the sapphire substrate to form a split zone. Thus, the sapphire substrate may be removed to expose the buffer layer 112.

Figure 5C:
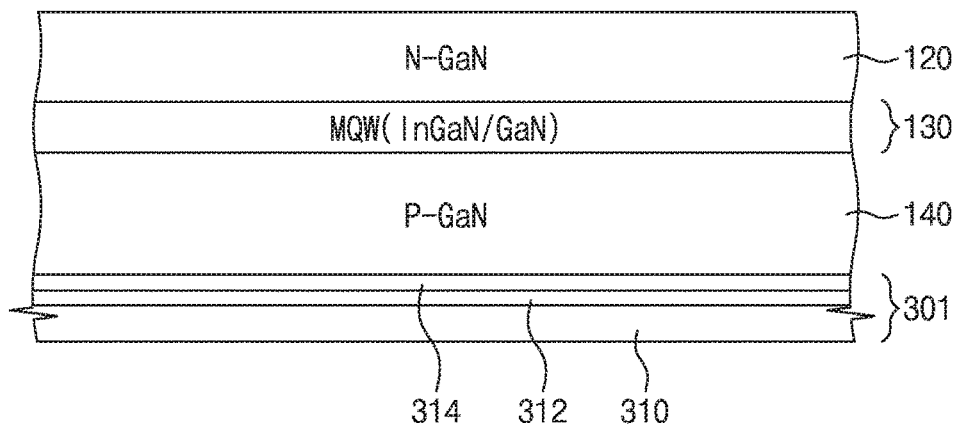

Referring to FIG. 5C, the exposed buffer layer 112 may be removed. Accordingly, the n-type GaN layer 120 may be exposed.

Figure 5D:
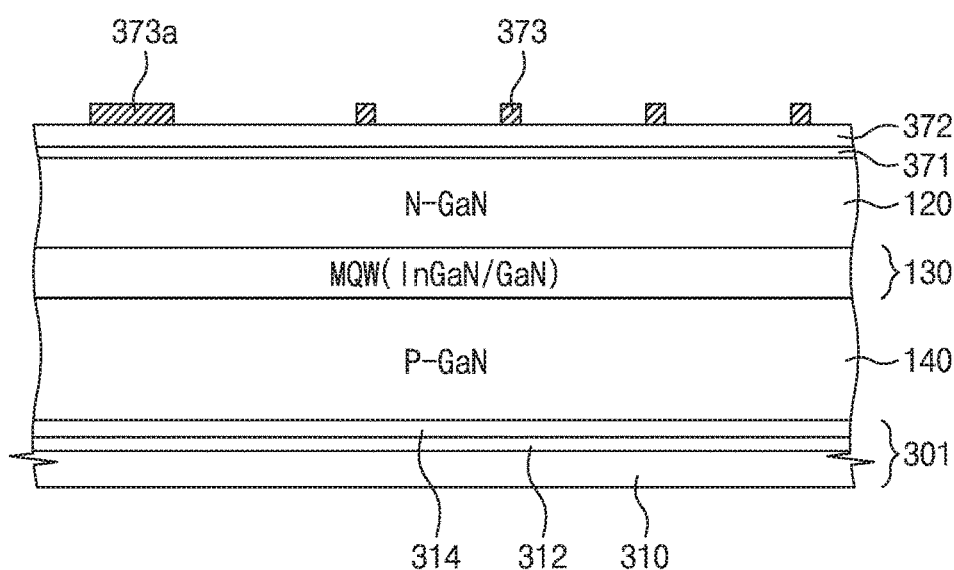

Referring to FIG. 5D, an ohmic contact layer 371 and a current spreading layer 372 may be sequentially formed on the n-type GaN layer 120. Thereafter, a lift-off process may be used to pattern upper current injection electrodes 373 and auxiliary upper current injection electrode 373a on the current spreading layer 372. The upper current injection electrodes 373 may be spaced apart from each other and may be aligned to each other on a line.

Figure 5E:
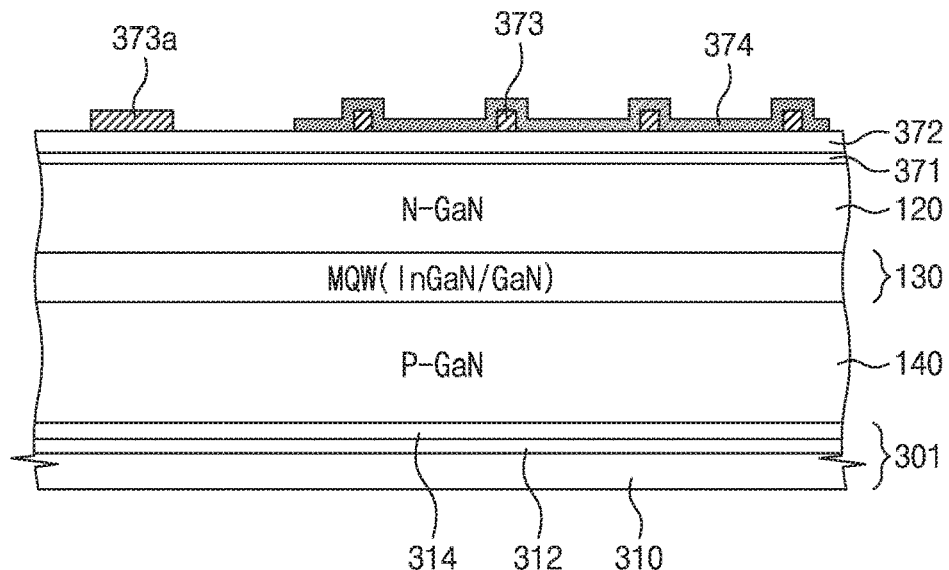

Referring to FIG. 5E, a lift-off process may be used to form a first upper electrode pattern 374 covering the upper current injection electrodes 373. The first upper electrode pattern 374 may be formed to expose the auxiliary upper current injection electrode 373a.

Figure 5F:
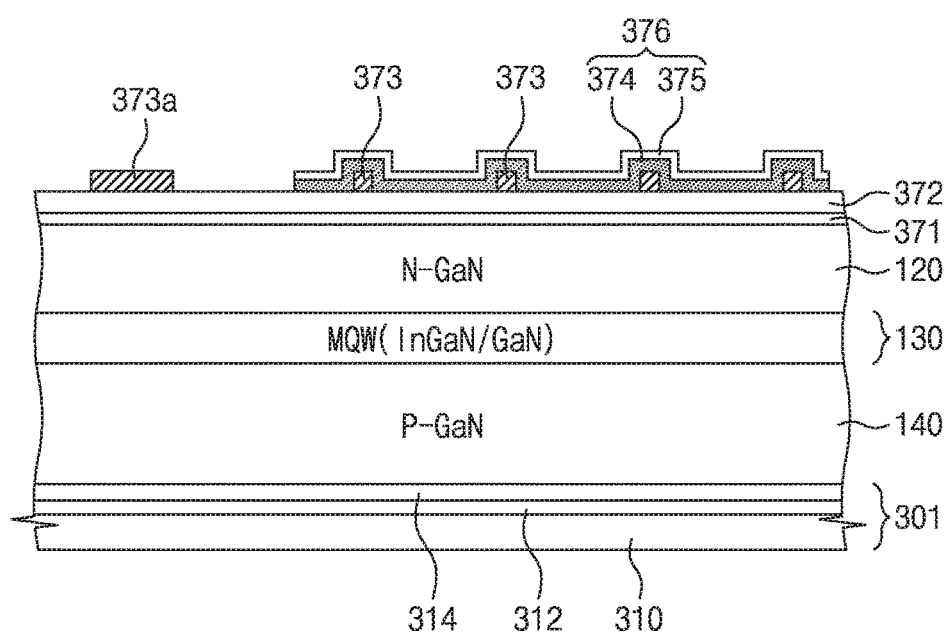

Referring to FIG. 5F, a second upper electrode pattern 375 may be formed on the first upper electrode pattern 374 using a lift-off process. The first upper electrode pattern 374 and the second upper electrode pattern 375 may be aligned to each other in a vertical direction.

Referring back to FIG. 4B, an upper electrode pad 379 may be formed on the auxiliary upper current injection electrode 373a using a lift-off process.

In a metal oxide/metal/metal oxide (O/M/O) structure, a material with high refractive index (e.g., ITO, $TiO_2$, $SnO_2$, ZnO, AZO, or $Y_2O_3$) may be used as the metal oxide material, and a material (e.g., silver (Ag) or silver alloys) having a low absorption coefficient for visible light may be used as the metal material. By controlling a thickness of each of the metal oxide layer and the metal layer in the O/M/O structure, it may be possible to realize high transmittance within a specific wavelength range (e.g., red, green, or blue). Furthermore, if current injection electrodes are provided between the metal oxide layer and the metal layer, the current injection electrodes may be used to efficiently inject or supply a current to the metal oxide layer thereunder. Accordingly, it may be possible to obtain spatially uniform light-emitting distribution and high light extraction efficiency.

According to some embodiments of the inventive concept, a current spreading layer and an electrode pattern may be provided to have an O/M/O structure, which makes it possible to realize high transmittance (e.g., of 85% or higher) and maintain low sheet resistance. Micrometer-sized current injection electrodes may be embedded in the O/M/O structure, and they may be used to compensate the disadvantage (e.g., low current injection efficiency) of the O/M/O structure. Thus, it may be possible to obtain the advantage (e.g., high transmittance and low sheet resistance) of the O/M/O structure and to improve light extraction efficiency and current injection efficiency of the LED device.

While example embodiments of the inventive concepts have been particularly shown and described, it will be understood by one of ordinary skill in the art that variations in form and detail may be made therein without departing from the spirit and scope of the attached claims.

What is claimed is:

1. A GaN light-emitting diode (LED) device, comprising:
   a substrate,
   an n-type GaN layer stacked on the substrate;
   an active layer stacked on the n-type GaN layer;
   a p-type GaN layer stacked on the active layer;
   a current spreading layer stacked on the p-type GaN layer, the current spreading layer including a transparent conductive metal oxide material;
   a plurality of upper current injection electrodes provided on the current spreading layer to be spaced apart from each other;
   an upper electrode pattern extending to cover the upper current injection electrodes; and
   an upper electrode pad electrically connected to the upper electrode pattern,
   wherein the upper electrode pattern comprises a first upper electrode pattern and a second upper electrode pattern, which are sequentially stacked,
   the first upper electrode pattern is a thin layer made of silver (Ag) or silver alloy, and
   the second upper electrode pattern comprises a thin layer made of a transparent conductive metal oxide material.

2. The GaN LED device of claim 1, wherein the upper current injection electrodes are formed of Ti, Al, Cr, Au, Ti/Al, Cr/Al/Ti/Au, or Cr/Ni/Au.

3. The GaN LED device of claim 1, wherein the current spreading layer has a thickness ranging from 10 nm to 50 nm,
   the first upper electrode pattern has a thickness ranging from 15 nm to 20 nm, and
   the second upper electrode pattern has a thickness ranging from 10 nm to 50 nm.

4. The GaN LED device of claim 1, wherein the current spreading layer and the second upper electrode pattern comprises at least one of indium tin oxide (ITO), ZnO, $Sn_2O_3$, $TiO_2$, or indium gallium zinc oxide (IGZO).

5. The GaN LED device of claim 1, further comprising an auxiliary upper current injection electrode provided below the upper electrode pad.

6. The GaN LED device of claim 1, further comprising a current blocking layer provided between the upper electrode pad and the current spreading layer.

7. The GaN LED device of claim 1, further comprising:
   a lower electrode pattern provided in an etched region of the n-type GaN layer to be in contact with the n-type GaN layer; and
   a lower electrode pad provided to be in electric contact with the lower electrode pattern,
   wherein the lower electrode pattern comprises:
   a first lower electrode pattern provided on the n-type GaN layer;
   a second lower electrode pattern provided on the first lower electrode pattern; and
   a third lower electrode pattern provided on the second lower electrode pattern,
   wherein the second lower electrode pattern is a thin layer formed of silver or silver alloy, and
   the first lower electrode pattern and the third lower electrode pattern is a thin layer formed of a transparent conductive metal oxide material.

8. The GaN LED device of claim 7, further comprising an ohmic contact pattern provided between the lower electrode pattern and the exposed n-type GaN layer.

9. The GaN LED device of claim 1, further comprising a plurality of lower current injection electrodes, which are provided between the first lower electrode pattern and the second lower electrode pattern and are spaced apart from each other.

10. A GaN light-emitting diode (LED) device, comprising:
    a p electrode;
    a p-type GaN layer provided on the p electrode;
    an active layer provided on the p-type GaN layer;
    an n-type GaN layer provided on the active layer;
    a current spreading layer provided on the n-type GaN layer, the current spreading layer comprising a transparent conductive metal oxide material;
    a plurality of upper current injection electrodes provided on the current spreading layer to be spaced apart from each other;
    an upper electrode pattern extending to cover the upper current injection electrodes; and
    an upper electrode pad electrically connected to the upper electrode pattern,
    wherein the upper electrode pattern comprises a first upper electrode pattern and a second upper electrode pattern, which are sequentially stacked,
    the first upper electrode pattern is a thin layer made of silver (Ag) or silver alloy, and
    the second upper electrode pattern comprises a thin layer made of a transparent conductive metal oxide material.

11. The GaN LED device of claim 10, wherein the upper current injection electrodes have a layered structure of Ti, Al, Cr, Au, Ti/Al, Cr/Al/Ti/Au, or Cr/Ni/Au.

12. The GaN LED device of claim 10, wherein the current spreading layer has a thickness ranging from 10 nm to 50 nm,
    the first upper electrode pattern has a thickness ranging from 15 nm to 20 nm, and
    the second upper electrode pattern has a thickness ranging from 10 nm to 50 nm.

13. The GaN LED device of claim 10, wherein the current spreading layer and the second upper electrode pattern comprises at least one of indium tin oxide (ITO), ZnO, Sn$_2$O$_3$, TiO$_2$, or indium gallium zinc oxide (IGZO).

14. The GaN LED device of claim 10, further comprising an auxiliary upper current injection electrode provided below the upper electrode pad.

15. A GaN light-emitting diode (LED) device, comprising:
   an n-type GaN layer;
   an active layer stacked on the n-type GaN layer;
   a p-type GaN layer stacked on the active layer;
   an n electrode used to apply a current to the n-type GaN layer; and
   a p electrode used to apply a current to the p-type GaN layer,
   wherein the n electrode or the p electrode comprises a first transparent conductive metal oxide layer, a metal layer stacked on the transparent conductive metal oxide layer, and a second transparent conductive metal oxide layer stacked on the metal layer, and
   metallic current injection electrodes are provided between the first transparent conductive metal oxide layer and the metal layer and are spaced apart from each other in an extension direction of the n or p electrode.

* * * * *